(12) United States Patent
Grabolla et al.

(10) Patent No.: US 8,932,405 B2
(45) Date of Patent: Jan. 13, 2015

(54) APPARATUS FOR LOW-TEMPERATURE EPITAXY ON A PLURALITY SEMICONDUCTOR SUBSTRATES

(75) Inventors: Thomas Grabolla, Arensdorf (DE); George Ritter, Frankfurt (DE); Bernd Tillack, Frankfurt (DE)

(73) Assignee: IHP GmbH—Innovations for High Performance Microelectronics/Institut fur Innovative Mikroelektronik, Frankfurt an der Oder (DE)

( * ) Notice: Subject to any disclaimer, the term of this patent is extended or adjusted under 35 U.S.C. 154(b) by 1951 days.

(21) Appl. No.: 11/579,276

(22) PCT Filed: May 10, 2005

(86) PCT No.: PCT/EP2005/052123
§ 371 (c)(1),
(2), (4) Date: Aug. 15, 2007

(87) PCT Pub. No.: WO2005/108643
PCT Pub. Date: Nov. 17, 2005

(65) Prior Publication Data
US 2008/0050929 A1    Feb. 28, 2008

(30) Foreign Application Priority Data
May 10, 2004    (DE) .......................... 10 2004 024 207

(51) Int. Cl.
C23C 16/00    (2006.01)
C23C 16/54    (2006.01)
C30B 25/08    (2006.01)

(52) U.S. Cl.
CPC ................. *C23C 16/54* (2013.01); *C30B 25/08* (2013.01)

USPC ...... 118/719; 118/724; 118/725; 156/345.31; 156/345.32

(58) Field of Classification Search
USPC .......................... 156/345.31, 345.32; 118/719
See application file for complete search history.

(56) References Cited

U.S. PATENT DOCUMENTS

| | | | |
|---|---|---|---|
| 5,303,671 A | 4/1994 | Kondo et al. | |
| 5,388,944 A | 2/1995 | Takanabe et al. | |
| 5,766,360 A | 6/1998 | Sato et al. | |

(Continued)

FOREIGN PATENT DOCUMENTS

| | | | |
|---|---|---|---|
| DE | 10144431 A1 * | 2/2003 | |
| JP | 55107236 A * | 8/1980 | |

(Continued)

*Primary Examiner* — Karla Moore
(74) *Attorney, Agent, or Firm* — Ware, Fressola, Maguire & Barber LLP

(57) ABSTRACT

A reactor arrangement for layer deposition on a plurality of substrates (hereafter substrates) comprising a first reactor chamber for simultaneous cleaning the substrates, at least one second reactor chamber for depositing at least one layer on each of the substrates, a first heating device for setting the substrate temperature of the substrates in the first reactor chamber, a second heating device for setting the substrate temperature of the substrates in the second reactor chamber, a device for producing a gas atmosphere of predetermined composition and predetermined pressure, a transport device for transporting the substrates simultaneously from the first to the second reactor chamber, and a control device for controlling the heating devices and device for producing the gas atmosphere in such a way that the substrates are moved or stored in an interruption-free manner in a reducing gas atmosphere as long as the substrate temperature is above critical temperature $T_c$.

15 Claims, 5 Drawing Sheets

(56) References Cited

U.S. PATENT DOCUMENTS

| | | | |
|---|---|---|---|
| 5,820,366 A * | 10/1998 | Lee | 432/241 |
| 6,079,354 A * | 6/2000 | Guo et al. | 118/719 |
| 6,425,951 B1 | 7/2002 | Chu et al. | |
| 6,488,778 B1 * | 12/2002 | Ballantine et al. | 118/719 |
| 7,682,496 B2 * | 3/2010 | Cohen | 204/298.25 |
| 2003/0045063 A1 | 3/2003 | Oda | |
| 2003/0098125 A1 * | 5/2003 | An | 156/345.31 |
| 2004/0266142 A1 * | 12/2004 | Tillack et al. | 438/478 |

FOREIGN PATENT DOCUMENTS

| | | |
|---|---|---|
| JP | 03055840 A * | 3/1991 |
| JP | 10199870 A | 7/1998 |
| WO | WO 03/012840 A2 | 2/2003 |

* cited by examiner

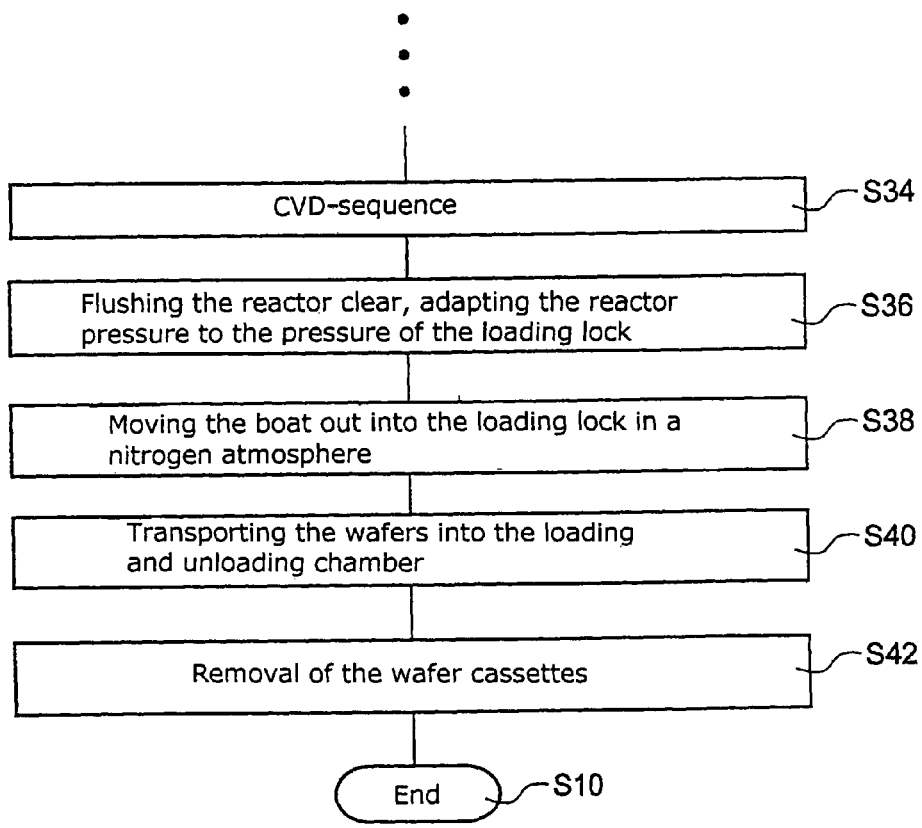
Fig. 3 (Continuation)

| Method step | Location | Medium | Temperature |
|---|---|---|---|
| S50 Flushing | Transfer chamber | $N_2$ | RT |
| S52 Transfer | Transfer chamber ⇒ prebake lock chamber | $N_2$ | RT |
| S54 Flushing/pumping | Prebake lock chamber | $N_2$ | RT |
| S56 Introducing boat | Prebake lock chamber ⇒ prebake reactor chamber | $N_2$ | RT→650°C |
| S58 Heating | Prebake reactor chamber | $H_2$ | 650°C→900°C |
| S60 Prebake | Prebake reactor chamber | $H_2$ | 900°C |
| S62 Cooling | Prebake reactor chamber | $H_2$ | 900°C→650°C |
| S64 Boat out and cooling | Prebake reactor chamber ⇒ prebake lock chamber | $H_2$ | 650°C→<200°C |
| S66 Flushing | Prebake lock chamber | $N_2$ | <200°C→RT |
| S68 Transfer | Prebake lock chamber ⇒ epitaxy lock chamber | $N_2$ | RT |
| S70 Flushing/pumping | Epitaxy lock chamber | $N_2$ | RT |
| S72 Flushing | Epitaxy lock chamber | $H_2$ | RT |
| S74 Boat in | Epitaxy lock chamber ⇒ epitaxy reactor chamber | $H_2$ | RT→600°C |
| S76 Epi process | Epitaxy reactor chamber | Process gases | 600°C |
| S78 Boat out and cooling | Epitaxy reactor chamber ⇒ epitaxy lock chamber | $N_2$ | 600°C→RT |
| S80 Transfer | Epitaxy lock chamber ⇒ transfer chamber | $N_2$ | $N_2$ |

Fig.4

APPARATUS FOR LOW-TEMPERATURE EPITAXY ON A PLURALITY SEMICONDUCTOR SUBSTRATES

CROSS REFERENCE TO RELATED APPLICATIONS

This application is for entry into the U.S. national phase under §371 for International Application No. PCT/EP2005/052123 having an international filing date of May 10, 2005, which claims priority under 35 USC §119 to German Patent Application No. 10 2004 024 207.0-33 filed on May 10, 2004.

BACKGROUND OF THE INVENTION

1. Technical Field

The present invention concerns a method of depositing layers on a plurality of semiconductor substrates simultaneously and a reactor arrangement for layer deposition on a plurality of substrates.

2. Discussion of Related Art

The development of silicon-germanium-carbon technology has made it possible to manufacture semiconductor devices which contain functional layers with a hitherto unattainable combination of a particularly small layer thickness and a high level of dopant concentration. In that way it was possible for the economically highly developed silicon technology also to be used for devices which are suitable for high frequency, and in part replace the hitherto dominant technology based on III-V semiconductors such as gallium arsenide.

Si/SiGe—C technology profits on the one hand from the advantageous electronic properties of Si/SiGe heterostructures over pure Si structures and on the other hand from the dual effect of the incorporation of carbon. Carbon can compensate for lattice dislocation adaptation of SiGe in relation to Si and in addition represses the diffusion of dopants, which as a consequence leads to unwanted layer spread in transistor structures.

The advantages of Si/SiGe—C technology however could come to fruition only on the basis of the accompanying development of new deposition methods which are adapted to the particular demands of the new semiconductor structures. Thus low-temperature deposition methods were developed, which as far as possible avoid diffusion-promoting process steps at high temperatures.

WO 03/012840 A2 discloses such a low-temperature method of manufacturing thin epitaxial layers. In those methods a plurality of substrates are initially subjected to external preliminary cleaning and then subjected to a hydrogen treatment at a high temperature of between 750 and 1100° C. ("hydrogen prebake"). After that preliminary treatment the substrates are coated in a low-pressure hot or warm wall batch reactor at temperatures which are lower in comparison with the hydrogen treatment.

It is further known from WO 03/012840 A2 for the hydrogen prebake operation to be carried out in a first reactor chamber and for the layer deposition operation to be carried out in a second reactor chamber. After the hydrogen prebake step the substrates are transferred from the first reactor chamber into the second. Transport is effected through a transport chamber in an inert atmosphere or vacuum.

U.S. Pat. No. 6,488,778 B1 discloses a similar arrangement. A problem with the method described in those documents is transport between the reactor chambers after the hydrogen treatment. Due to the change in the gas atmosphere at elevated substrate temperatures, unwanted reactions can occur and fresh impurities can come about on the surface of the substrates which have just been cleaned, and they can adversely affect the homogeneity of the subsequent layer deposition operation. In addition handling of the wafers for transport from the first reactor chamber into the second chamber is complicated and time-consuming.

Therefore the technical object of the invention is to provide a method of and an apparatus for layer deposition, in which the above-specified disadvantages do not occur.

DISCLOSURE OF INVENTION

The method aspect of the above mentioned object is attained by a method of deposition of layers on a plurality of semiconductor substrates simultaneously, comprising the following steps:

simultaneous cleaning of at least one respective surface of the plurality of semiconductor substrates in a first reactor at a first substrate temperature $T_{red}$, simultaneous transport of the plurality of semiconductor substrates from the first reactor into a second reactor, and subsequent deposition of at least one respective layer on the semiconductor substrates in the second reactor at a second substrate temperature $T_{dep}$.

In the method according to the invention the semiconductor substrates which hereinafter are also referred to for brevity as substrates are further moved or stored during the cleaning step and during transport from the first reactor into the second reactor in an interruption-free manner in a reducing gas atmosphere as long as the substrate temperature is above a critical temperature $T_c$ which is dependent on the substrate material and the material of the at least one layer to be deposited.

The method according to the invention is based on the realization that an adverse effect on the homogeneity of layer deposition by impurities or reactions which have undesirably occurred after the hydrogen treatment of the substrates is a phenomenon which is dependent on temperature. It is possible to determine a critical temperature $T_c$ which is dependent on the substrate material and above which layer deposition is adversely affected. In the case of silicon the critical temperature is at values somewhat above 200° C.

In accordance with the invention the plurality of substrates, during the cleaning operation and during subsequent transport from the first reactor into the second reactor, is moved or stored without interruption in a reducing gas atmosphere as long as the substrate temperature is greater than or equal to the critical temperature $T_c$. In that way it is possible to produce particularly homogenous layers in the subsequent layer deposition procedure.

The method according to the invention also has the advantage of permitting rapid more robust substrate transport. Storage and transport of the substrates at temperatures above the critical temperature in a reducing gas atmosphere like a hydrogen atmosphere cause passivation of the substrate surfaces. Originally open valencies at the surface of the substrate are occupied by atoms of the gas of the reducing gas atmosphere. The passivation achieved in that way, for example hydrogen passivation, is maintained at temperatures below the critical temperature sufficiently long to ensure substrate transport in a nitrogen atmosphere without the risk of troublesome surface reactions. Unwanted reactions with oxygen or moisture during substrate transport even at low temperatures can be suppressed in that fashion.

In a preferred embodiment of the method according to the invention the substrates during transport from the first reactor into the second reactor are transported out of the reducing gas atmosphere after the substrate temperature has fallen below the critical temperature. In that way on the one hand transport of the substrates can be begun while still in the reducing gas atmosphere, whereby further time is gained. On the other hand the entire operation of transporting the semiconductor substrates from the first reactor into the second reactor does not have to be performed in a reducing gas atmosphere. After the above-discussed passivation of the surfaces in a reducing gas atmosphere such as for example a hydrogen atmosphere above the critical temperature the substrates can also be moved in another gas atmosphere, for example in an inert gas atmosphere such as a nitrogen atmosphere or in a vacuum. Less complication and expenditure is required for that purpose than for providing reactor regions which have to be changed over to a reducing gas atmosphere.

In a further embodiment of the method according to the invention transport of the substrates from the first reactor into the second reactor includes the following steps:

transporting the substrates from the first reactor into a first lock chamber of adjustable temperature and gas atmosphere at a substrate temperature above the critical temperature $T_c$, cooling the substrates in the first lock chamber to a substrate temperature below the critical temperature $T_c$, and transporting the substrates from the first lock chamber into the second reactor.

By virtue of using the first lock chamber the substrates can be transported after the hydrogen treatment in the first reactor in a reducing gas atmosphere. As a result the first reactor becomes free again for receiving fresh substrates. The substrates which have just been cleaned can then be cooled in the first lock chamber in the reducing gas atmosphere until they have fallen below the critical temperature $T_c$. Transport of the substrates into the second reactor can then be effected in an inert gas atmosphere or in a vacuum. For that purpose for example the gas atmosphere in the first lock chamber is replaced or pumped out until the desired conditions for further transport have occurred. The lock chamber can then be opened and the substrates can be further transported to the second reactor.

In a further configuration of the method according to the invention the first lock chamber is associated with the first reactor. Transport of the substrates from the first lock chamber into the second reactor includes in that respect the following steps:

if necessary changing over the gas atmosphere in the second lock chamber to a reducing gas atmosphere, heating the substrates to a substrate temperature above the critical temperature $T_c$, and transporting the substrates into the second reactor in the reducing gas atmosphere.

That method involves two lock chambers. The first lock chamber serves for transporting and storing the substrates prior to and after the hydrogen prebake operation. The second lock chamber serves for transporting and storing the substrates prior to and after the layer deposition operation. In this embodiment, the layers are heated with the introduction of the substrates into the second reactor in the reducing gas atmosphere in the second lock chamber to a substrate temperature above the critical temperature $T_c$.

In this case also it is conceivable that one or more further substrate carriers are already stored during deposition of a number of substrates in the second reactor in the second lock chamber and are brought to the temperature required for the deposition operation.

A further embodiment of the method according to the invention provides for transport of the substrates from the first lock chamber into the second lock chamber through a transport chamber with a non-reducing gas atmosphere. It will be appreciated that in accordance with the invention that is effected only at temperatures below the critical temperature $T_c$.

In a further embodiment the gas atmosphere in the second reactor upon the introduction of the substrates is at a temperature required for heating the substrates to the second substrate temperature $T_{dep}$.

The method according to the invention can also be carried out without transport and storage of the substrates in lock chambers. In such an embodiment for example the first and the second reactors are arranged in mutually adjoining relationship and can be separated from each other by gas-tight and vacuum-tight closures. After the cleaning step in the first reactor and prior to the layer deposition step in the second reactor in this embodiment the following steps are carried out:

cooling the substrates in the first reactor to a substrate temperature which is equal to the deposition temperature $T_{dep}$ in the second reactor, changing over the gas atmosphere in the second reactor to a reducing gas atmosphere, transporting the substrates into the second reactor, and if necessary changing over the gas atmosphere in the second reactor to the gas atmosphere required for the layer deposition operation.

The reducing gas atmosphere is preferably an ultra-pure reducing gas atmosphere. Ultra-pure in this context means that impurities are present only in a concentration of in total less than 10 ppb.

Preferably the reducing gas atmosphere comprises hydrogen, wherein the residual content of oxidizing constituents such as for example oxygen and moisture such as water vapor is no higher than 1 ppb.

As already explained in the opening part of this specification the critical temperature depends on the substrate material used and the material of the layer to be deposited. The critical temperature is typically lower than the deposition temperature $T_{dep}$. In a preferred embodiment the following relationship applies between the first and second substrate temperatures $T_{red}$ and $T_{dep}$ and the critical temperature $T_c$:

$$200°\ C. < T_c < T_{dep} < T_{red} < 1000°\ C.$$

In that case $T_{red}$ denotes the temperature of the reducing gas atmosphere during the hydrogen prebake operation. For the situation of deposition on silicon the deposition temperature is typically between 500° C. and 700° C.

Preferably the method according to the invention is performed simultaneously with at least 25 substrates.

The method is particularly suitable for deposition on silicon substrates. It is however also possible to envisage other substrate materials, for example silicon-germanium, silicon carbide or germanium.

Preferably at least one epitaxial layer is deposited in the second reactor. Additionally or alternatively the deposition step in another embodiment includes the deposition of at least one dielectric layer on the substrates.

In a preferred embodiment the method according to the invention is carried out in parallel on a plurality of batches. While a first plurality of substrates is subjected to the deposition step at the same time at least one second plurality of substrates is subjected to the cleaning step. In that way it is possible to achieve a marked increase in the wafer throughput per hour in comparison with single-chamber systems and in comparison with implementation of the method according to the invention with only one plurality of substrates at the same time, that is to say only one batch.

As the deposition step generally lasts markedly longer than the cleaning step a plurality of batches can also be cleaned during the deposition operation. After the prebake and cooling to below the critical temperature the second batch, that is to say the second plurality of substrates, is either stored in the lock chamber or in the transport chamber until the first batch, that is to say the first plurality, has been moved after the deposition step after out of the lock chamber of the deposition reactor. Storage in the transport chamber is advantageous in the situation where a third or still further batches are provided for cleaning in the prebake reactor while the first batch is being subjected to the deposition step in the deposition reactor.

The foregoing consideration motivates an embodiment of the reactor arrangement according to the invention, comprising two or more second reactor chambers for carrying out the deposition operation. In this embodiment the cleaned batches do not have to be stored long but can be transported immediately to the respective next deposition chamber which comes free, or a lock chamber provided there. Parallel implementation of the deposition step in a plurality of deposition reactors permits a further increase in efficiency.

A further embodiment of the method according to the invention provides that the first substrate temperature $T_{red}$ is set by short-term irradiation of a respective substrate with a light source. In that way the thermal budget to which the substrates are exposed can be markedly reduced. In addition there is a saving on complicated and expensive heating devices at the prebake reactor chamber. Unlike heating the entire reactor chamber, this embodiment provides that each substrate of a batch is irradiated individually. Therefore it is only exposed for a short time to a defined heating output.

Preferably in that case a respective substrate is irradiated either with a light flash or with a plurality of light flashes, in which the number, frequency spectrum, intensity and duration of the light flash or light flashes are so selected that the substrate is heated for a predetermined period of time to the first substrate temperature $T_{red}$. To carry out a surface cleaning operation, a period of time of a maximum of 10 seconds in a hydrogen atmosphere at the first substrate temperature is sufficient.

In accordance with a further aspect of the invention there is provided a reactor arrangement for layer deposition on a plurality of substrates. The reactor arrangement according to the invention comprises:
- a first reactor chamber which is adapted to carry out simultaneous cleaning of the plurality of substrates,
- at least one second reactor chamber which is adapted for the deposition of at least one respective layer on each of the plurality of substrates,
- a first heating device for setting the substrate temperature of the substrates in the first reactor chamber,
- a second heating device for setting the substrate temperature of the substrates in the second reactor chamber,
- a device for producing a gas atmosphere of predetermined composition and predetermined pressure selectively in the first reactor chamber or in the second reactor chamber or in both reactor chambers, and
- a transport device which is adapted to transport the plurality of substrates simultaneously from the first reactor chamber into the second reactor chamber.

In addition provided in the reactor arrangement according to the invention is a control device which is connected to the heating devices and the device for producing the gas atmosphere and which is adapted to control the heating devices and the device for producing the gas atmosphere in such a way that the substrates during the cleaning operation and during a subsequent transport step of the cleaned substrates from the first reactor into the second reactor are moved or stored in an interruption-free manner in a reducing gas atmosphere as long as the substrate temperature is above a critical temperature $T_c$ which is dependent on the substrate material and the material of the at least one layer to be deposited.

The reactor arrangement according to the invention is adapted to carry out the layer deposition method in accordance with the first aspect of the invention. The control device of the reactor arrangement according to the invention coordinates the interplay of the heating devices and the device for producing the gas atmosphere of predetermined composition and predetermined pressure. Control is effected with the proviso that the substrates, during the cleaning operation and during subsequent transport of the cleaned substrates from the first reactor into the second reactor are moved or stored in an interruption-free manner in a reducing gas atmosphere as long as the substrate temperature is above the critical temperature $T_c$. Advantages of the reactor arrangement according to the invention arise on the one hand directly out of the description of the advantages of the method according to the invention.

In the reactor arrangement according to the invention the first and second reactor chambers are separate from each other and each serve for carrying out respective clearly defined method steps. Thus the second reactor chamber is used for the layer deposition procedure and not for carrying out a cleaning operation on the substrates. That has advantages in regard to the purity of the atmosphere in the substrate cleaning operation (prebake) and in the layer deposition operation, as well as the frequency of necessary cleaning procedures for the reactor chambers themselves. Substrate cleaning is typically effected at a temperature which is increased in relation to the layer deposition operation. If substrate cleaning and substrate deposition are carried out in one chamber, the temperature of the chamber must be increased for the cleaning operation and later reduced again for the layer deposition operation. In the layer deposition operation, a deposit also occurs at the walls of the reactor chamber. Because of the thermal cycles in successive cleaning and deposition steps, that wall deposit in a reactor arrangement in accordance with the state of the art can peel off, in particular during the high-temperature phases, by virtue of the layer stresses which occur in the thermal cycles in the deposit on the walls. Thus the gas atmosphere can be contaminated during the substrate cleaning operation, whereby the purity of the substrate surfaces is detrimentally affected. That risk is at least reduced in the reactor arrangement according to the invention. The deposited layers are very substantially free of foreign particles and thus enjoy particularly good layer quality.

In the reactor arrangement according to the invention the second reactor chamber can also be cleaned more easily and less frequently because the chamber can always kept at the same temperature, the deposit on the walls of the reactor is less and, because of the constant temperature, no thermally produced stresses occur in the wall deposit layer, which result in it peeling off. That permits the reactor according to the invention to have a longer service time between necessary reactor cleaning procedures, irrespective of whether that is effected in the form of in-situ cleaning or in the form of external cleaning with a reactor change. The reactor arrangement according to the invention therefore enjoys increased efficiency in comparison with known arrangements.

In an embodiment of the reactor arrangement according to the invention the first reactor chamber and the second reactor chamber each have at least one respective opening for the through-transport of the plurality of substrates. Both openings are closable by means of at least one gas-tight and vacuum-tight closure. In this embodiment the reactor chambers are in mutually adjoining relationship at least in a region which includes at least one opening. This arrangement without lock chambers is particularly compact in terms of the space it occupies. It will be noted however that it suffers from the disadvantage that the through-put of substrates is reduced in comparison with an arrangement with lock chambers.

An alternative embodiment provides a first lock chamber which is connected to the first reactor chamber by way of a common opening closable with a sealingly closing closure.

In addition in a further embodiment there is a second lock chamber which is connected to the second reactor chamber by way of a common opening closable with a sealingly closing closure.

In this embodiment, there can advantageously be provided between the first lock chamber and the second lock chamber a transport chamber which is connected to them by a respective opening closable with a sealingly closing closure, wherein provided in the transport chamber is a transport device which is adapted to transport the plurality of substrates from the first lock chamber into the second lock chamber. That permits interruption-free transport of the plurality of wafers in unison. The transport device used for that purpose can be for example a transport robot. Preferably a multi-finger robot is used, which in an embodiment is adapted to simultaneously transport 25 wafers.

In a further embodiment the first heating device which is used for setting the temperature during the hydrogen prebake operation is adapted to heat the gas atmosphere in the first reactor chamber to a maximum of about 1000° C.

The first and second heating devices are preferably of such a design and are each controlled in a suitable fashion such that the temperature of the substrates which is required for the hydrogen prebake operation and the deposition operation respectively is already achieved during the introduction of the substrates into the first and second reactor chambers respectively. The efficiency of the procedure can be further enhanced in that way because, immediately after the introduction of the substrates into the respective reactor chamber, it is possible to begin with the cleaning operation and the deposition sequence respectively.

The step of heating the substrates can be effected as already described hereinbefore in connection with an embodiment of a method according to the invention, alone or with the assistance of short-term irradiation of the substrates. For that purpose in an embodiment of the reactor arrangement the first heating device includes an irradiating device which is adapted to deliver radiation pulses of a predetermined number, a predetermined frequency spectrum, a predetermined intensity and a predetermined duration, in such a way that a substrate irradiated with the radiation pulse or the radiation pulses at a predetermined spacing from the irradiating device is heated for a predetermined period of time to the first substrate temperature $T_{red}$.

Preferably moreover there is provided a first pressure control device which is associated with the first reactor chamber and which is adapted to set the pressure of the gas atmosphere in the first reactor chamber to atmospheric pressure or a slightly reduced pressure and to maintain that pressure.

Furthermore the reactor arrangement according to the invention in another embodiment has a cooling device which is adapted to cause in the first reactor chamber a temperature drop in the gas atmosphere by a maximum of 40 K/min. The through-put of the first reactor can be increased by rapid temperature changes of that kind. A cooling device of that kind is not required if heating of the substrates is effected solely with the irradiating device. It is however appropriate if the heating device includes on the one hand an irradiating device and on the other hand a heating means which involves the entire reactor atmosphere, in which respect a "base temperature" in the prebake reactor is set with the heating means and the irradiating device heats the substrates, starting from that base temperature.

In a particularly preferred embodiment the device for producing the gas atmosphere is additionally connected to the first lock chamber and is adapted to produce in the first lock chamber a gas atmosphere of predetermined composition and predetermined pressure. In addition the first heating device, the device for producing the gas atmosphere and the control device are additionally adapted to set a reducing gas atmosphere in the first lock chamber to a temperature above the critical temperature $T_c$ and to maintain that temperature. The device for producing the gas atmosphere and the control device are also preferably adapted to set and maintain an ultra-pure hydrogen atmosphere with a residual content of oxidizing constituents of a maximum of 1 ppb.

Preferably moreover the device for producing the gas atmosphere is additionally connected to the second lock chamber and adapted to produce in the second lock chamber a gas atmosphere of predetermined composition and predetermined pressure. Furthermore the second heating device, the device for producing the gas atmosphere and the control device are additionally adapted to set a reducing gas atmosphere in the second lock chamber to a temperature above the critical temperature $T_c$ and to maintain said temperature.

Further preferred embodiments of the method according to the invention and the reactor arrangement according to the invention are set forth in the appendant claims.

BRIEF DESCRIPTION OF THE DRAWINGS

Embodiments by way of example of the invention are described hereinafter with reference to the Figures in which:

FIG. 4 shows a table view of the process implementation of a second embodiment in which at least two batches are processed in parallel.

DETAILED DESCRIPTION

Figure 1:
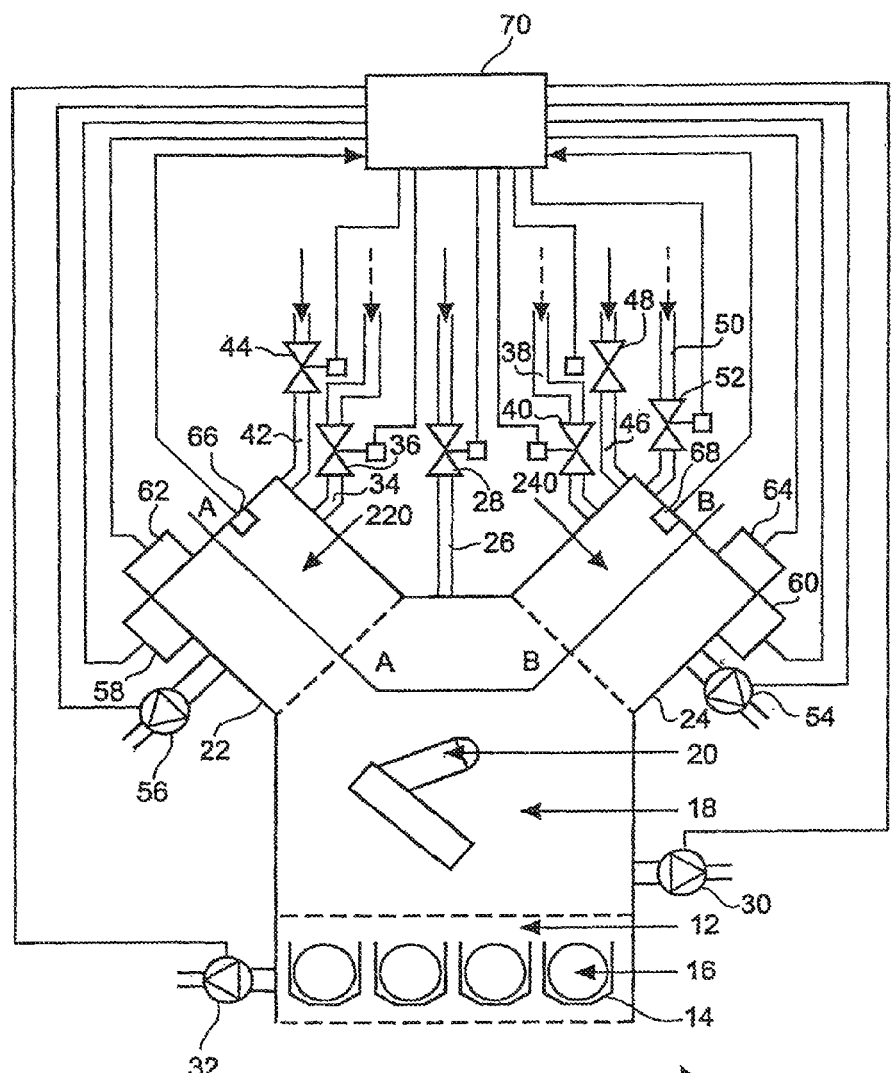
FIG. 1 is a diagrammatic simplified plan view of a reactor arrangement for low-temperature epitaxy.

An embodiment by way of example of the reactor arrangement is described hereinafter with simultaneous reference to FIGS. 1 and 2. FIG. 1 shows a diagrammatic simplified plan view of a reactor arrangement 10 for low temperature epitaxy. The reactor arrangement 10 includes the following components: a loading and unloading chamber 12 for the entry and exit of cassettes 14 with substrates 16, a transfer chamber 18 with integrated robot handler 20, and two process systems 22 and 24, also referred to herein as reactors. The reactor 22 serves for cleaning the substrates in a hydrogen atmosphere. The reactor 24 serves for coating the substrates. The robot handler is a multi-finger robot which simultaneously transports 25 wafers.

The two reactors 32, 42 involve on the one hand a low-pressure CVD reactor 42 for epitaxial deposition and on the other hand a system 32 which, under atmospheric conditions or a slightly reduced pressure, permits the implementation of a hydrogen treatment (prebake) at elevated temperatures (up to about 1000° C.). That reactor has forced cooling and is thus suitable for rapid temperature changes (up to about 40 K/min).

Figure 2:
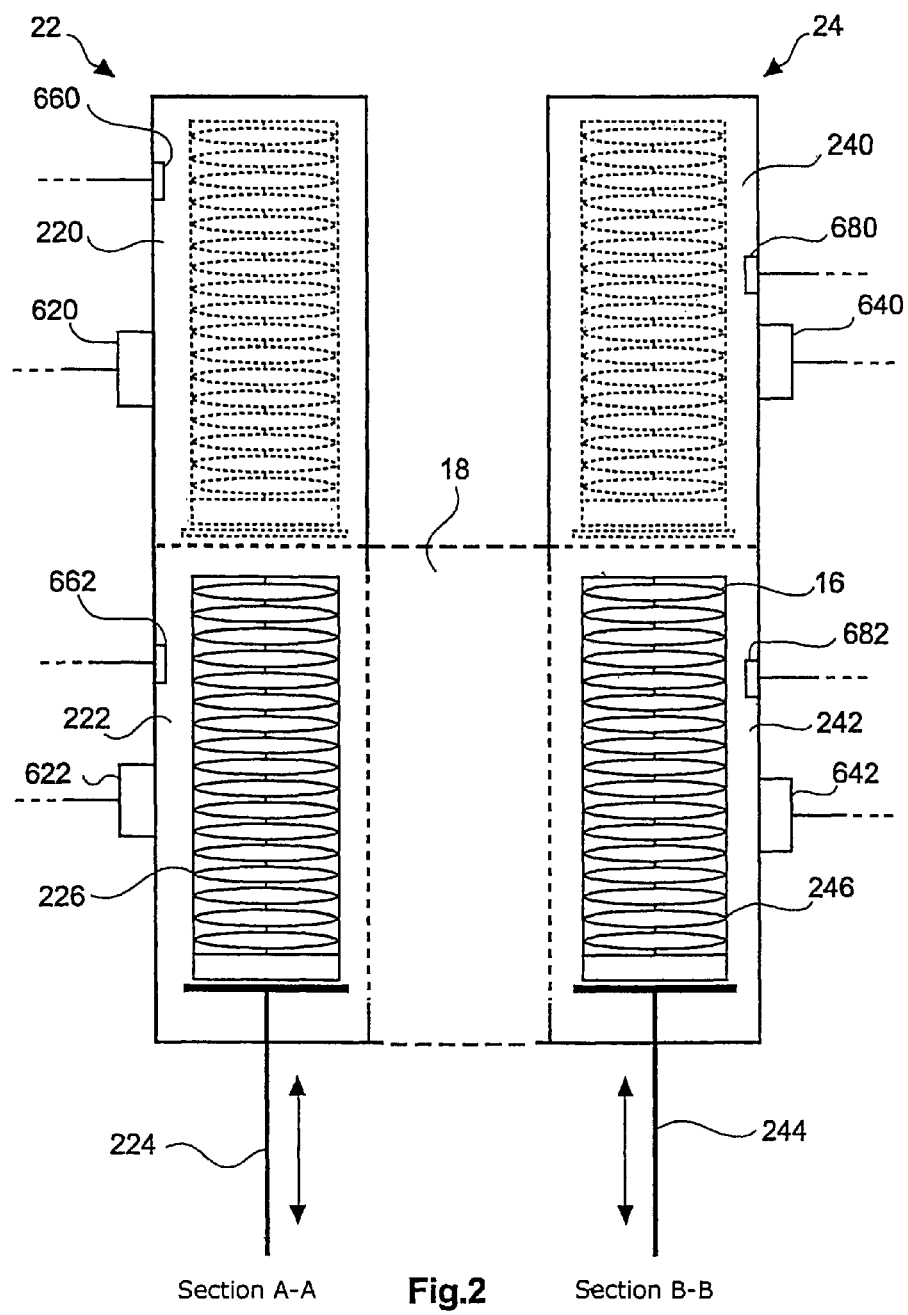
FIG. 2 shows sectional views of the two reactors of the reactor arrangement of FIG. 1 along lines A-A, A-B and B-B.

The structure of the reactors 22 and 24 can be seen from the diagrammatic and simplified sectional view in FIG. 2. The sectional view is along the lines A-A, A-B and B-B in FIG. 1, in which respect the distance A-B is not shown true to scale in relation to FIG. 1. The reactors 22 and 24 each have a respective reactor chamber 220, 240 and a respective lock chamber 222, 242. The lock chambers are also referred to as loadlock systems. The lock chambers are each disposed below the respectively associated reactor. All the above-mentioned chambers are separated among each other and from each other outwardly by sealingly closing doors which are symbolically indicated by broken lines in FIGS. 1 and 2.

Provided in each of the lock chambers is a respective lift 224, 244, by means of which quartz boats 226, 246 with a plurality of substrates 16 can be transported to and fro between the reactor chamber and the lock chamber associated therewith. A plurality of lifts can also be provided in each chamber, which can be operated independently of each other. Loading of the quartz boats 226 and 246 is effected in the respective lock chamber 222 and 242.

The loading and unloading chamber 12 and the transport chamber 18 can be flushed with inert gas. For the sake of enhanced simplicity that is shown in FIG. 1 only in relation to the transport chamber, more specifically by means of a feed line 26 and a valve 28 for controlling the gas flow by way of the line 26. The feed of inert gas is shown by a broken-line arrow 102 in FIG. 1 at the upper end of the illustrated portion of the feed line. An illustration of the carbon dioxide gas containers and a detailed discussion of the feed line system which is usual in the art are not included here. The transport chamber and the loading and unloading chamber can also be evacuated by means of pumps 30 and 32 respectively.

The loadlock systems 222 and 242 are also to be flushed with inert gas by way of suitable devices which are shown solely in FIG. 1. The feed flow of inert gas into the first lock chamber 222 beneath the first reactor chamber 220 by way of a feed line 34 is controlled by means of a valve 36. The feed flow of inert gas into the second lock chamber 242 beneath the second reactor chamber 240 by way of a feed line 38 is controlled by means of a valve 40.

The loadlock systems 222 and 242 additionally include devices for flushing with hydrogen. The hydrogen feed flow is identified by arrows with sold lines. The feed flow of hydrogen into the first lock chamber 222 by way of feed lines 42 is controlled by means of a valve 44. The feed flow of hydrogen into the second lock chamber 242 by way of feed lines 46 is controlled by means of a valve 48. The loadlock systems are adapted to leak-tightly enclose a hydrogen atmosphere.

In addition the controlled feed flow of process gases during the deposition operation into the second reactor chamber 240 by way of suitable feed lines is symbolized by way of example by an arrow with a dash-dotted line as well as a feed line 50 and a valve 52. Depending on the respective number of process gases to be used during the deposition operation, it will be appreciated that the required number of valves and feed lines is to be provided.

It should be added that the information set forth in the context of this description and shown in the Figures regarding the number and arrangement of the valves does not have to correspond to the actual conditions. The present description is limited to establishing that feed lines are present and that the feed flow can be controlled by means of a respective one or more valves. The configuration, arrangement and number of the feed lines and valves is established in accordance with the technical necessities by means of measures which are usual in the art.

All chambers can be evacuated by means of pumps 30, 32, 54 and 56.

In addition a respective cooling system which is integrated into each of the reactors 22, 24, for example by means of a water-cooled casing, permits the substrates to be moved out of the reactor chambers 220, 240 at high temperatures and subsequently permits rapid cooling thereof in the associated lock chambers 222, 242. The cooling system of the first reactor 22 is illustrated diagrammatically by means of a block 58. That reactor has a forced cooling arrangement and is thus suitable for fast temperature changes (up to about 40 K/min). The cooling system of the second reactor 24 is diagrammatically illustrated by means of a block 60.

The first and second reactor chambers as well as the first and second lock chambers are each individually heatable with corresponding heating devices. In FIG. 1, by virtue of the diagrammatic illustration therein, heating systems 62 and 64 at the first and second reactors 22, 24 are each only shown as a whole. Irrespective thereof however each of the four specified chambers is equipped with its own heating device. That is shown in FIG. 2. The heating system 62 at the first reactor 22 has a heating device 620 for the first reactor chamber 220 and a heating device 622 for the first lock chamber 222. The heating system 64 at the second reactor 24 has a heating device 640 for the second reactor chamber 240 and a heating device 642 for the second lock chamber 242.

Provided in all four chambers, namely the lock chambers 222, 242 and the reactor chambers 220 and 240, are temperature sensors, representatively identified in FIG. 1 by blocks 66 and 68 at the first and second reactors, and also illustrated in FIG. 2 by blocks 660 in the first reactor chamber, 662 in the first lock chamber, 680 in the second reactor chamber and 682 in the second lock chamber. Furthermore, provided in all chambers of the reactor arrangement are pressure sensors which are not shown here for the sake of simplicity of the illustration.

A control device 70 is connected at the input side to the temperature and pressure sensors of all chambers. It is further connected at the output side to the above-mentioned valves, pumps, heating devices and cooling devices and controls the operating condition thereof.

Figure 3:
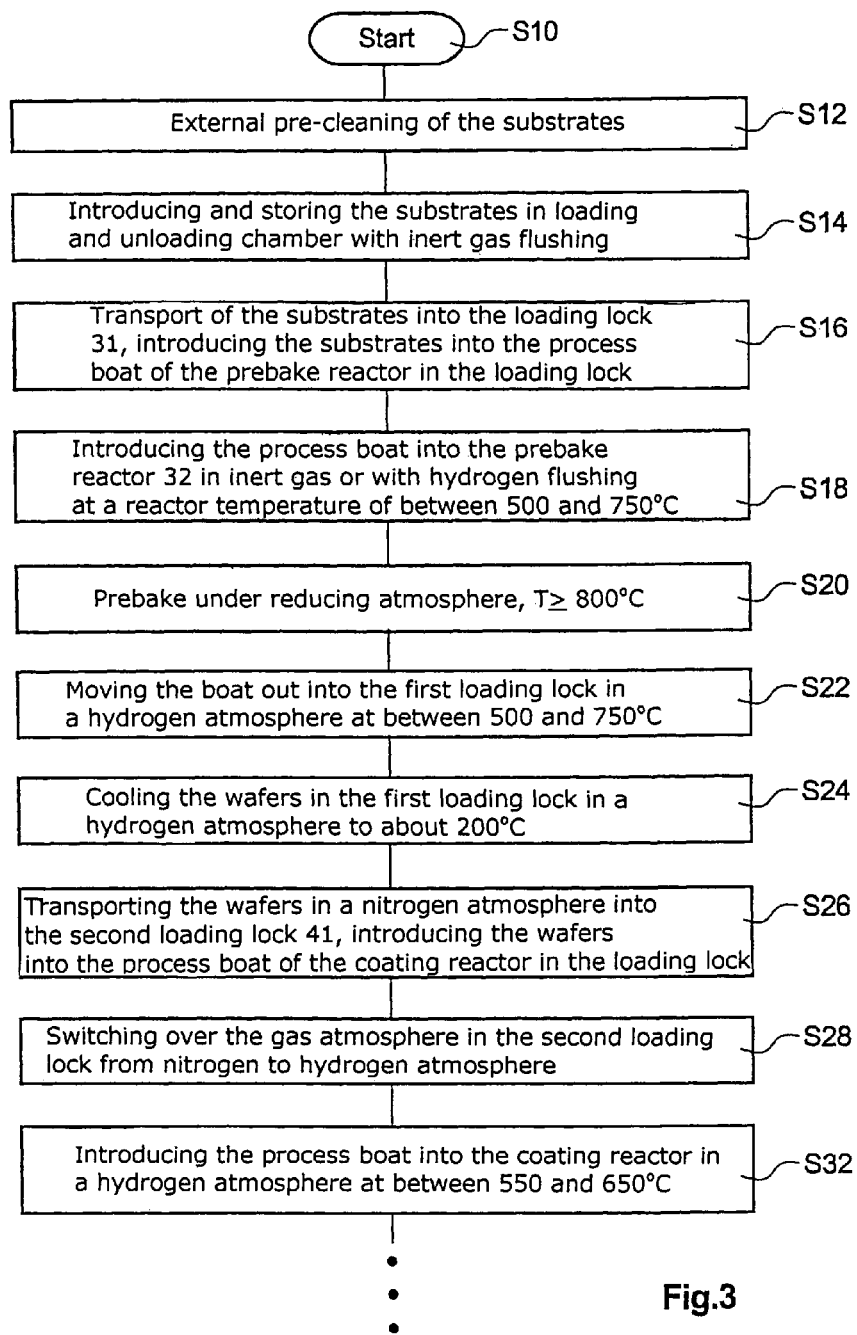
FIG. 3 shows a flowchart of a first embodiment of the method according to the invention.

The mode of operation of the control device will be apparent from the description hereinafter of an embodiment of the method according to the invention with reference to the flow-chart in FIG. 3.

Unless expressly specified otherwise hereinafter, all chambers are under permanent inert gas flushing. The residual content of moisture and oxygen is monitored by way of suitable measuring devices and should have a fall from the loading and unloading chamber 12 by way of the transport chamber 18, the first lock chamber 222 towards the first reactor chamber 220, and the second lock chamber 242 towards the second reactor chamber 240, to lower values.

If active transport operations do not prevent that, doors basically remain closed.

The method is started at a step S10. After external pre-cleaning of the substrates (for example Piranha/SC1/HF-dip/SC2/DI) in a step S12 they are introduced into the loading and unloading chamber 12 in a step S14 and remain here under inert gas flushing until a sufficiently low residual content of moisture and oxygen is reached.

Then in a step S16 transfer of the substrates is effected by means of robots 20 into a process boat 226 of the prebake system 22, the boat being disposed in the first loadlock chamber 222. If necessary a rapid further reduction in the residual content of moisture and oxygen can be achieved by an alternate succession of pumping out and inert gas or hydrogen flushing.

The subsequent introduction of the process boat 226 into the first reactor chamber 220 also takes place in a step S18 under inert gas or hydrogen, at a reactor temperature of between 500 and 750° C. The subsequent prebake treatment takes place in a step S20 under a reducing atmosphere (hydrogen) at temperatures≥800° C.

After the boat comes out in a hydrogen atmosphere and again at between 500 and 750° C. in a step S22 the substrates remain in the lock chamber 222 and here cool down in hydrogen in a step S24 to about 200° C.

It is only now that in a step S26 in nitrogen the wafers are transferred into the boat 246 in the loadlock chamber 242 beneath the CVD reactor chamber 240. Then in a step S28 the system is switched over to a hydrogen atmosphere which is also maintained during the introduction operation in a step S32. In that case the reactor chamber 240 is already set to the region of the temperature of the later deposition procedure (between about 550 and 650° C.).

In a step S34 a CVD-typical sequence of process steps takes place for setting the process parameters for epitaxial deposition, with the control of pressure, temperature and the flow of the process gases in the reactor chamber 240 by the control device 70.

After deposition has occurred the reactor 240 is flushed clear in a step S36 and the pressure matched to that of the loadlock chamber 242.

The exit of the boat is followed in a step S40 by transfer back into the loading and unloading chamber 12 by the robot 20.

After removal of the cassettes in a step S42 the process is concluded in a step S44.

FIG. 4 shows a second embodiment of the method according to the invention in a tabular view. In this embodiment, at least two batches are processed in parallel relationship. That makes it possible to speed up the method and thus achieve an increase in the wafer through-put, in comparison both with a dual-chamber system in which there is only ever one batch that is processed, and also in relation to a conventional single-chamber system.

All steps S50-S80 through which a batch passes are shown in the left-hand column in the tabular view of FIG. 4. Those steps substantially correspond to the operating procedure already described with reference to FIG. 3. The column which is next to it at the right ("Location") states where the method step of a respective line is performed. The next column ("Medium") specifies the gas atmosphere which is set during the method step in question. The right-hand column specifies the temperature at which the method step is performed. In that respect the abbreviation RT denotes room temperature. An arrow (=>) between two temperature values indicates that the temperature is altered from the temperature value to the left of the arrow to the temperature value to the right of the arrow, during implementation of the method step.

The method of this embodiment is described in greater detail hereinafter. In a step S50 the substrates are arranged in the transfer chamber. The transfer chamber is flushed. Then, in a step S52, transfer of a first batch into the first lock chamber 222 beneath the prebake reactor chamber 220 takes place. After conclusion of the transfer the lock chamber 222 is flushed with nitrogen and pumped out in a step S54 in order to obtain an atmosphere which is as pure as possible. The steps S50-S54 are carried out at room temperature. Then the process boat is introduced into the prebake reactor chamber 220 in a step S56. That step takes place in a nitrogen atmosphere. The reactor chamber 220 is heated to a temperature of 650° C. In a subsequent step S58 the gas atmosphere of the prebake reactor chamber is replaced by hydrogen and the temperature increased to 900° C. In a step S60 the prebake operation then takes place at 900° C. in a hydrogen atmosphere. Thereafter in a step S62 cooling to 650° C. is effected and in a step S64 the boat is moved out into the lock chamber 222 and here cooled to a temperature below 200° C. The lock chamber 222 is then flushed with nitrogen and cooled down to room temperature in a step S66.

The above-described process implementation of a prebake operation is subsequently repeated for a further batch while at the same time the first batch is subjected to further processing as described hereinafter.

The first batch is transported at room temperature in a nitrogen atmosphere out of the lock chamber 222 of the prebake reactor into the lock chamber 242 of the epitaxy reactor. The lock chamber 242 is then flushed with nitrogen and pumped out in a step S70. In a subsequent step S72 the lock chamber 242 is flushed with hydrogen at room temperature. In a subsequent step S74 the temperature of the lock chamber 242 is increased from room temperature to 600° C. and the process boat with the first batch is introduced into the reactor chamber 240. Then, the epitaxy process takes place at a temperature of about 600° C. in the reactor chamber 240, with process gases being introduced into the reactor chamber 240 in that operation. After the conclusion of the epitaxy process, in a step S78 the boat is moved back in a nitrogen atmosphere into the lock chamber 242 and the temperature in the lock chamber is reduced from 600° C. to room temperature again. Finally the first batch is transported back into the transfer chamber.

As the epitaxy process in the step S76 takes up the longest period of time (for example 2 hours), a plurality of batches can successively pass through the prebake process of steps S50-S66 during the epitaxy process. Batches whose treatment has been finished and which are waiting for epitaxy can be stored in the transfer chamber.

The above-described method, in comparison with a single-chamber system, achieved an increase in the wafer through-put from 29.3 wafers per hour to 35.3 wafers per hour, with each bath containing 100 product wafers.

The invention claimed is:

1. A reactor arrangement for layer deposition on a plurality of substrates comprising:
   a first reactor chamber configured to carry out simultaneous cleaning of the plurality of substrates,
   at least one second reactor chamber configured to deposit at least one respective layer on each of the plurality of substrates,
   a first heating device configured to set a substrate temperature of the plurality of substrates in the first reactor chamber,
   a second heating device configured to set a substrate temperature of the plurality of substrates in the second reactor chamber,
   a device configured to produce a gas atmosphere of predetermined composition and predetermined pressure selectively in the first reactor chamber or in the second reactor chamber or in both reactor chambers, and
   a transport device configured to transport the plurality of substrates simultaneously from the first reactor chamber into the second reactor chamber, wherein transport of the plurality of substrates leads through a transport chamber with a non-reducing atmosphere, and a control device, connected to the heating devices and the device configured to produce the gas atmosphere, the control device configured to control the heating devices and the device configured to produce the gas atmosphere in such a way that the plurality of substrates during the cleaning operation and during a subsequent transport step of the cleaned plurality of substrates from the first reactor into the second reactor are moved or stored in an interruption-free manner in a reducing gas atmosphere as long as the substrate temperature is above a critical temperature $T_c$ which is dependent on a substrate material of the plurality of substrates and a material of the at least one layer to be deposited.

2. A reactor arrangement as set forth in claim 1 in which the first reactor chamber and the second reactor chamber each have at least one respective opening for the through-transport of the plurality of substrates which are adapted to be closable by means of at least one gas-tight and vacuum-tight closure and in which
the reactor chambers are in mutually adjoining relationship at least in a region which includes at least one opening.

3. A reactor arrangement as set forth in claim 1 in which a first lock chamber is connected to the first reactor chamber by way of a common opening closable with a sealingly closing closure.

4. A reactor arrangement as set forth in claim 3 in which a second lock chamber is connected to the second reactor chamber by way of a common opening closable with a sealingly closing closure.

5. A reactor arrangement as set forth in claim 4 in which provided between the first lock chamber and the second lock chamber is the transport chamber which is connected to them by a respective opening closable with a sealingly closing closure, wherein provided in the transport chamber is the transport device which is adapted to transport the plurality of substrates from the first lock chamber into the second lock chamber.

6. A reactor arrangement as set forth in claim 4 in which
the device for producing the gas atmosphere is additionally connected to the second lock chamber and adapted to produce in the second lock chamber a gas atmosphere of predetermined composition and predetermined pressure, and in which
the second heating device, the device for producing the gas atmosphere and the control device are additionally adapted to set a reducing gas atmosphere in the first lock chamber to a temperature above the critical temperature $T_c$ and to maintain said temperature.

7. A reactor arrangement as set forth in claim 3 in which
the device for producing the gas atmosphere is additionally connected to the first lock chamber and is adapted to produce in the first lock chamber a gas atmosphere of predetermined composition and predetermined pressure, and in which
the first heating device, the device for producing the gas atmosphere and the control device are additionally adapted to set a reducing gas atmosphere in the first lock chamber to a temperature above the critical temperature $T_c$ and to maintain that temperature.

8. A reactor arrangement as set forth in claim 1 in which the transport device is a multi-finger robot which is adapted to simultaneously transport 25 wafers.

9. A reactor arrangement as set forth in claim 1 in which the first heating device is adapted to heat the gas atmosphere in the first reactor chamber to a maximum of about 1000° C.

10. A reactor arrangement as set forth in claim 1 in which the first heating device includes an irradiating device which is adapted to deliver radiation pulses of a predetermined number, a predetermined frequency spectrum, a predetermined intensity and a predetermined duration, in such a way that a substrate irradiated with the radiation pulse or the radiation pulses at a predetermined spacing from the irradiating device is heated for a predetermined period of time to a first substrate temperature.

11. A reactor arrangement as set forth in claim 1 comprising a first pressure control device which is associated with the first reactor chamber and which is adapted to set the pressure of the gas atmosphere in the first reactor chamber to atmospheric pressure or a slightly reduced pressure and to maintain that pressure.

12. A reactor arrangement as set forth in claim 1 in which the first reactor chamber has a cooling device which is adapted to cause a temperature drop in the gas atmosphere in the first reactor chamber by a maximum of 40 Kelvin per minute.

13. A reactor arrangement as set forth in claim 1 in which both reactor chambers form upstanding cylindrical bodies.

14. A reactor arrangement as set forth in claim 1 in which the second reactor chamber is of the type of a hot wall reactor, wherein the second heating device is arranged outside the reactor chamber.

15. A reactor arrangement as set forth in claim 1 with two or more second reactor chambers.

* * * * *